United States Patent [19]

Nelson et al.

[11] Patent Number: 5,928,367
[45] Date of Patent: *Jul. 27, 1999

[54] MIRRORED MEMORY DUAL CONTROLLER DISK STORAGE SYSTEM

[75] Inventors: Marvin D. Nelson; Barry J. Oldfield; Mark D. Petersen, all of Boise, Id.

[73] Assignee: Hewlett-Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/641,084

[22] Filed: Apr. 29, 1996

Related U.S. Application Data

[63] Continuation of application No. 08/369,842, Jan. 6, 1995, abandoned.

[51] Int. Cl.[6] .................................................. G06F 11/00
[52] U.S. Cl. ............................................ 714/6; 395/182.07
[58] Field of Search ..................... 395/182.03, 182.04, 395/182.05, 182.06, 182.07, 182.09, 489; 711/162, 161

[56] References Cited

U.S. PATENT DOCUMENTS

| | | | |
|---|---|---|---|
| 4,339,804 | 7/1982 | Davison et al. | 364/900 |
| 4,958,273 | 9/1990 | Anderson et al. | 364/200 |
| 5,155,835 | 10/1992 | Belsan | 395/425 |
| 5,155,845 | 10/1992 | Beal et al. | 395/575 |
| 5,193,154 | 3/1993 | Kitajima et al. | 395/182.04 |
| 5,195,100 | 3/1993 | Katz et al. | 371/66 |
| 5,204,952 | 4/1993 | Ayers et al. | 395/550 |
| 5,212,784 | 5/1993 | Sparks | 395/182.04 |
| 5,237,658 | 8/1993 | Walker et al. | 395/200 |
| 5,255,367 | 10/1993 | Bruckert et al. | 395/575 |
| 5,274,645 | 12/1993 | Idelman et al. | 395/182.04 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,297,258 | 3/1994 | Hale et al. | 395/275 |
| 5,361,347 | 11/1994 | Glider et al. | 395/575 |
| 5,418,921 | 5/1995 | Cortney et al. | 395/425 |
| 5,437,022 | 7/1995 | Beardsley et al. | 395/182.04 |
| 5,459,857 | 10/1995 | Ludlam et al. | 395/182.04 |
| 5,495,570 | 2/1996 | Heugel et al. | 395/182.09 |
| 5,546,539 | 8/1996 | Poling | 395/182.05 |
| 5,574,863 | 11/1996 | Nelson et al. | 395/182.04 |
| 5,682,471 | 10/1997 | Billings et al. | 395/182.13 |
| 5,699,510 | 12/1997 | Peterson et al. | 395/182.04 |

*Primary Examiner*—Joseph E. Palys
*Attorney, Agent, or Firm*—Lane R. Simmons

[57] ABSTRACT

A disk storage control system includes dual controllers having real-time, synchronous, mirrored memory therebetween to provide immediate, accurate, and reliable failover in the event of controller failure. Non-volatile random access memory provides retention of data during a loss of power and during the manipulation of hardware for purposes of repair. A communication path is established within the mirrored memory between the controllers to monitor and coordinate their activities. The state of the mirrored memory is continuously monitored for accuracy of the mirror and failure detection. Concurrent and ready access by a host computer to the same disk storage control data set from each controller is provided without need for extra manipulation or extra direct memory access (DMA) activity to satisfy host requests. Accordingly, either controller can provide immediate and reliable failover control for the disk storage system. Furthermore, either controller can be hot swapped in the event of failure without the need for preparatory intervention. Finally, a secondary controller can recover a mirror image from a failed stand alone controller memory to provide continued operations thereby so long as the mirrored memory was not the failing component.

19 Claims, 5 Drawing Sheets

| NO. | CONTROL MESSAGE | REPLY MESSAGE |
|---|---|---|
| 1. | ARE-YOU-ACTIVE (SLAVE TO MASTER) | YES-ACTIVE/NO-INACTIVE |
| 2. | TIMEOUT-I'M-BECOMING-MASTER (SLAVE TO MASTER) | OK-BECOMING-SLAVE |
| 3. | BROKEN-PLEASE-REPORT (SLAVE TO MASTER) | OK-REPORTING-BROKEN |
| 4. | TAKEOVER (MASTER TO SLAVE) | OK-TAKING-OVER |
| 5. | COMM-FAILURE | ACKNOWLEDGE-COMM-FAILURE |
| 6. | PLEASE-RESET | OK-RESETTING |
| 7. | UPDATE-TO-VALID-SLAVE | UPDATED-TO-VALID-SLAVE |
| 8. | NO-MESSAGE | NO-REPLY |

MIRRORED MEMORY DUAL CONTROLLER DISK STORAGE SYSTEM

CROSS REFERENCE TO RELATED APPLICATION(S)

This is a continuation of application Ser. No. 08/369,842 filed on Jan. 06, 1995, now abandoned.

FIELD OF THE INVENTION

This invention relates, in general, to computer disk storage system controllers and, more particularly, to real-time, mirrored memory controllers for providing accurate and immediate failover reliability.

BACKGROUND OF THE INVENTION

In high-reliability computer disk storage systems, there is a desire to have redundancy in all the physical parts which make up a subsystem to reduce the potential for loss of data and down time upon failure of a part. The use of dual disk storage controllers, each having its own memory, provides several major benefits to a disk storage system. For example, (1) a redundancy of storage information is retained to allow for recovery in the case of failure or loss of one controller or its memory; (2) repair of a disabled controller is feasible due to the failover capabilities of the secondary controller; and (3) greater system up time is achieved through the secondary controller being available.

With the desire for more performance out of these redundant subsystems, caching and the use of memory as temporary storage has become common-place. However, the means by which these duplicate physical memories are kept in synchronization can be difficult. Some disk systems use a latent (delayed or massive update) process to create this duplication, but that approach tends to add expense, is very complex to manage, reduces performance, and limits the accuracy of recovery from failures. Another approach (the one used in this invention) is to form a real-time mirrored memory process to create and retain accuracy during the process of duplication of data. The use of real-time, synchronized, redundant memory (mirrored memory) in dual controllers can improve speed and accuracy in the case of a failover from one controller to the other.

Accordingly, objects of the present invention are to provide a dual controller disk storage system having real-time, synchronous, mirrored memory for providing immediate, accurate, and reliable failover in the event of failure of one controller or its memory.

SUMMARY OF THE INVENTION

According to principles of the present invention in its preferred embodiment, a disk storage control system includes dual controllers having real-time, synchronous, mirrored memory therebetween to provide immediate, accurate, and reliable failover in the event of failure of one controller or its memory. Non-volatile random access memory provides retention of data during the loss of power and during the manipulation of hardware for purposes of repair of a controller. A communication path is established within the mirrored memory between the controllers to monitor and coordinate their activities. The state of the mirrored memory is continuously monitored for accuracy of the mirror and failure detection.

This system and method provides concurrent and ready access for each controller to the same disk storage control data set without need for additional manipulation or extra direct memory access (DMA) activity to satisfy host requests because an exact copy of the data set resides in each controller memory (i.e., the mirror effect). Accordingly, either controller can provide immediate failover control for the disk storage system. Furthermore, either controller can be hot swapped in the event of failure without the need for preparatory intervention. Finally, in the event of a failed stand alone controller, a secondary controller can be physically inserted into the system to recover a mirror image from the failed controller's memory as long as the shared mirrored memory was not the failing component.

Other objects, advantages, and capabilities of the present invention will become more apparent as the description proceeds.

DETAILED DESCRIPTION OF THE INVENTION

Figure 1:
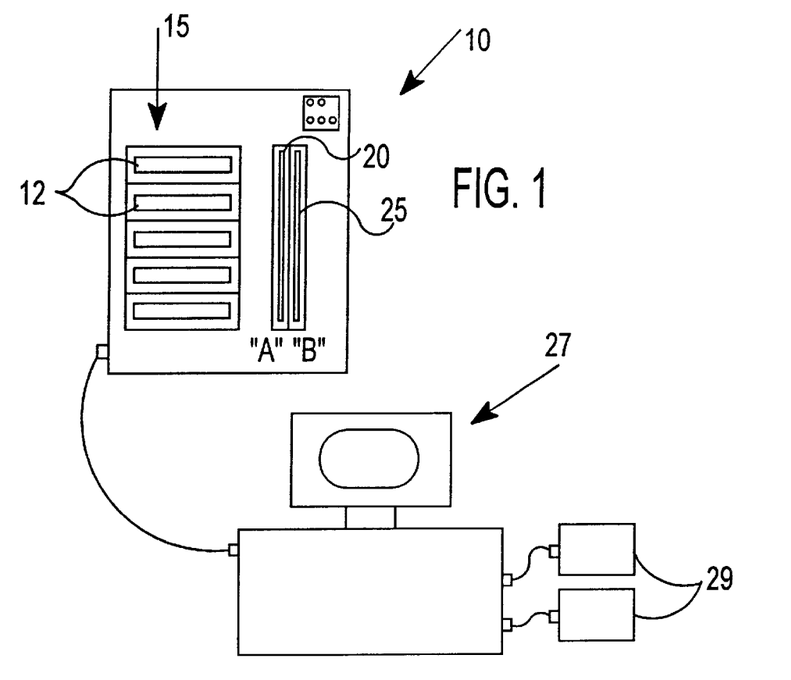
FIG. 1 is a block diagram representing an overview of the present invention computer disk storage control system having dual controllers.

FIG. 1 is a system diagram representing an overview of the present inventive dual controller disk storage system. A disk storage system is depicted generally at 10, having disk storage devices 12 depicted generally at disk drive array 15, and dual disk storage controllers depicted at 20 (in slot "A") and 25 (in slot "B"). Disk storage system 10 is shown as a separate component from computer 27 and peripheral devices 29 but could be contained within a common enclosure.

Figure 2:
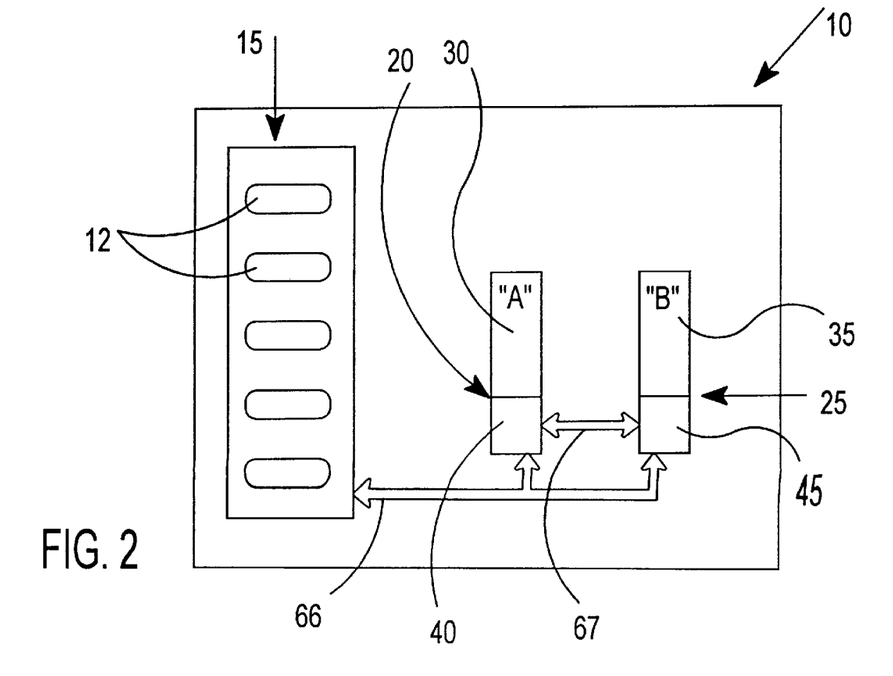
FIG. 2 is a more detailed block diagram of the dual controller disk storage system of FIG. 1.

In reference to FIG. 2, controllers 20 and 25 each have memory 30 and 35, respectively. Although most any type of Random Access Memory (RAM) is suitable for use as memory 30 and 35, in the preferred embodiment a non-volatile RAM (or volatile RAM made non-volatile by use of a power supply backup) is used to allow for retention of data in the event of a power failure, controller failure, communications failure, or the like. Although only dual controllers 20 and 25 are shown in the diagram and discussed generally herein, it will be obvious that the teachings expressed and implied herein are likewise applicable in a multiple controller environment, i.e., more than two controllers.

Each memory 30 and 35 is a mirrored memory. As is well known in the art, mirrored memory simply means that data in one memory is duplicated or "mirrored" in another memory. As used in the present invention, mirrored memory means that data in the memory of one controller is duplicated or "mirrored" in the memory of the other controller. In the preferred embodiment, the mirrored memory is a real-time mirrored memory, i.e., a single microprocessor or direct memory access updates data into or retrieves data from both memories 30 and 35 substantially concurrently. The existence of dual controllers, and mirrored memory in each, provides a fault tolerant environment for disk storage system 10.

For the purpose of this discussion, accuracy of failover is the ability of a dual controller system to failover in the presence of anomalies without data loss. Reliability of failover is the ability of a dual controller system to detect and recover from differing hardware failures. Accuracy refers to how well the system failed over, and reliability refers to how many situations the system can failover from. For example, this disclosure includes a monitoring function which ensures that the failover memory image is consistent with the primary image. This certainly improves the accuracy but does little to enhance reliability. In contrast, other features concentrate on reliability but do not tend to enhance accuracy.

Disk controllers 20 and 25 include control logic 40 and 45 that, among other functions in a preferred embodiment, control the mirroring process, maintain low level mirroring accuracy, and low level failure detection of the mirroring process. In alternate embodiments, the control logic may be in a central location separate from the controllers. Low level detection works on an access by access basis looking for abnormalities in that specific operation, i.e., the hardware level detection of failure. In contrast, a logical level of failure includes a detection in an inconsistency in the mirrored images, detection of major hardware failures, and inability of the board to communicate regarding system events.

Data flow between the controllers and disk array 1 5 is through the disk assembly backplane at 66. Data flow between controller 20 and 25 is also via the backplane at 67.

Figure 3:
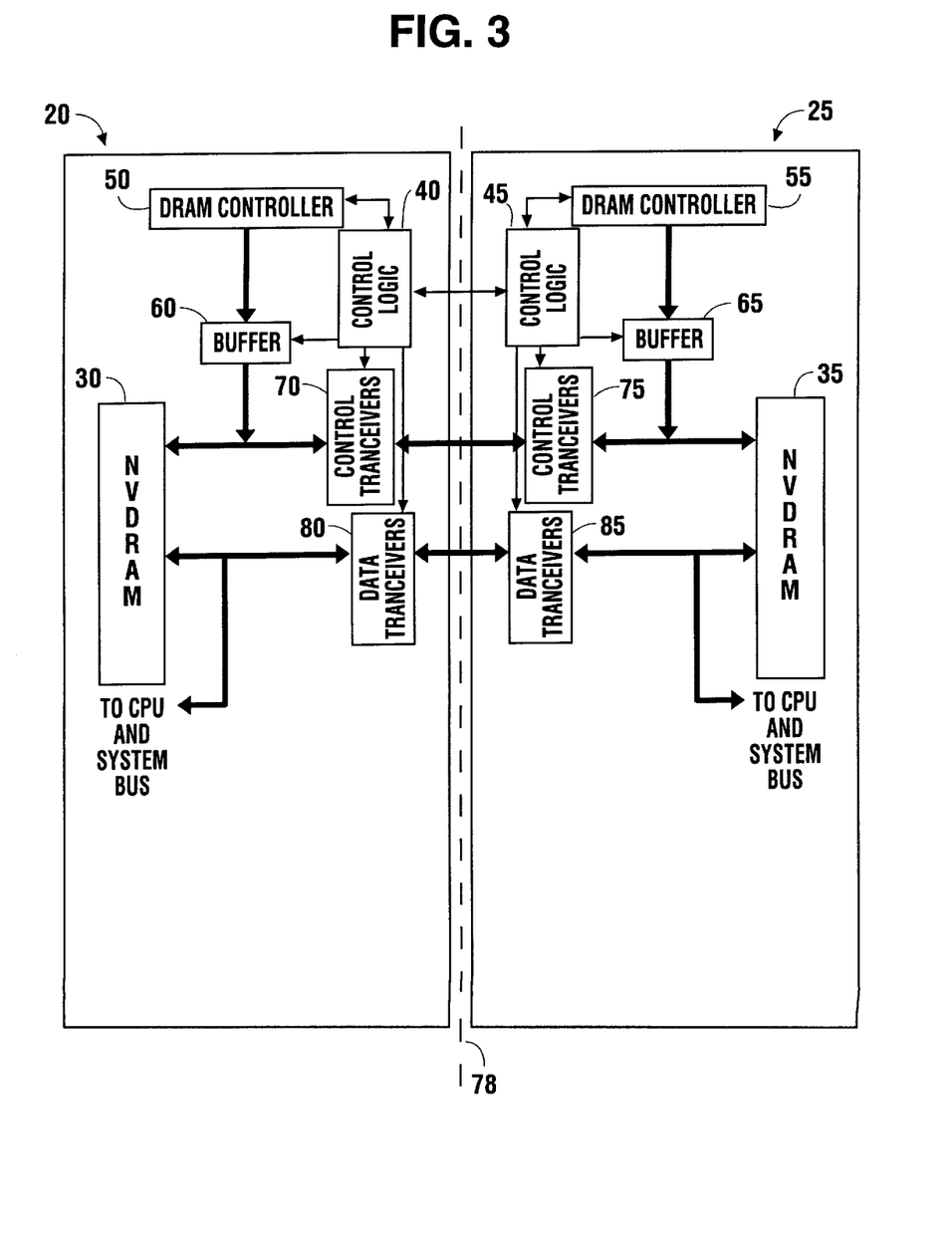
FIG. 3 is a schematic block diagram of control circuitry of the present invention.

Referring now to FIG. 3, a schematic block diagram of the present invention system is shown for writing data to each controller memory, whereby real-time, synchronous, mirrored memory is obtained. Similar components between figures retain similar reference numbers. Accordingly, each controller 20 and 25 is referenced generally, each mirrored memory 30 and 35 is referenced as Non Volatile Dynamic Random Access Memory (NVDRAM) as used in the preferred embodiment, and control logic 40 and 45 are likewise referenced as in FIG. 2. For simplicity purposes, NVDRAM will be referred to herein as DRAM. All directional arrows indicate paths of communication and/or transfer of data.

To provide for a substantially complete and immediate operational failover from one controller to the other, two key hardware factors must be accounted for: (1) the mirrored memory 30 and 35 must be retained synchronous and accurate on a real-time, consistent basis; and (2) controller failure, data transfer failure, and memory failure must be detected as soon as the failure occurs.

Accordingly, control logic 40 and 45 contribute to monitoring and controlling the dual controller relationship to satisfy these two key factors for providing failover. Namely, signals are exchanged between the controllers (control logic) to: inform the other controller as to the working status of each controller; selectively control the real-time, synchronous, mirroring process; and detect failures. Consequently, when a low level failure is detected, the mirror can be selectively disabled, and complete, accurate, and immediate failover can occur.

In continued reference to FIG. 3, the means and method for retaining a real-time, synchronous, mirrored memory is described as follows:

Each DRAM controller 50 and 55 has its own internal clock (not shown) for governing its respective circuitry and for purposes such as initiating a request for memory refresh. Likewise, each control logic 40 and 45 has its own internal clock whereby a response timeout may be detected during negotiations between controllers, i.e., from one control logic to the other. Control logic 40 and 45 control which controller is granted access to the memories 30 and 35, and which controller is disabled from accessing the same. As such, control logic 40 and 45 talk to and arbitrate/negotiate, respectively, with each other, with DRAM controllers 50 and 55, buffers 60 and 65, control transceivers 70 and 75, and data transceivers 80 and 85.

As common in the art, DRAM controllers 50 and 55 manage and generate timing and control logic signals, such as Row Address Strobe (RAS), Column Address Strobe (CAS), Write Enable (WE), Output Enable (OE) etc., for accessing appropriate addresses in DRAM 30 and 35, respectively. Buffers 60 and 65 are DRAM controller buffers for enabling/disabling each DRAM controller 50 and 55 with respect to accessing DRAM 30 and 35 respectively.

Control transceivers 70 and 75 are bidirectional transceiver buffers for a local controller (i.e., the controller on which the transceiver resides) to (1) drive address signals to a backplane 78 of the computer system to access the other (remote) controller's memory, or (2) receive address signals from the remote controller through the backplane to access the local controller's memory. Likewise, data transceivers 80 and 85 are bidirectional transceiver buffers for a local controller to (1) drive data signals to the backplane 78 to send to the remote controller, or (2) receive data signals from the remote controller through the backplane.

Figure 4:
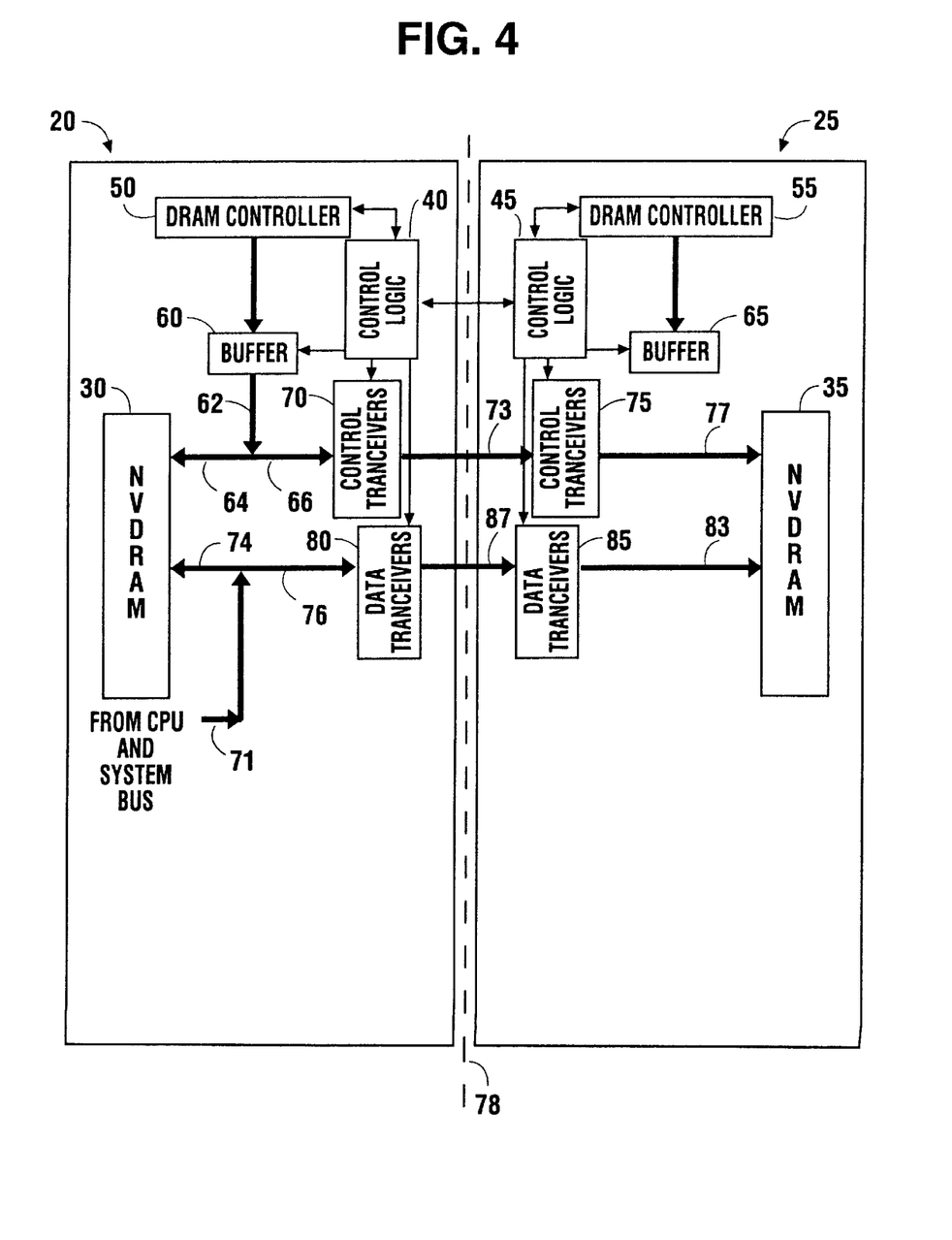
FIG. 4 is the schematic block diagram of FIG. 3 wherein uni-directional paths of data flow are depicted exemplary of a real-time, synchronous, mirrored memory write access from controller 20 to controller 25.

Operation of FIG. 3 is best described by an example as shown in FIG. 4. FIG. 4 is the same as FIG. 3 except that the bi-directional arrows of FIG. 3 are substituted in FIG. 4 with uni-directional arrows depicting the actual directional paths of data transfer for a real-time, synchronous write to both sides of the mirrored memory by controller 20.

In the following discussion, it should be noted that "hardware states", such as Master, Slave, Request, etc., are transitions in a state machine for controlling the mirroring process. In contrast, similarly named "logical states" refer to which of the controllers are servicing a host request in an active/passive dual controller relationship.

In the event that controller 20 initiates a write to memory, DRAM controller 50 asserts a Request signal to its own control logic 40. Control logic 40 then enters a hardware Request state and waits for control logic 45 of controller 25 to enter into a hardware Slave state (assuming controller 25 currently has access to the mirror). A hardware Request state is when the local control logic 40 (in this example) waits for the remote control logic 45 to grant local controller 20 access to remote DRAM 35. A hardware Slave state is when remote control logic 45 disables DRAM controller buffer 65 (in this example) to grant local controller 20 access to DRAM 35.

More specifically, when DRAM controller 55 of controller 25 completes its cycle for using the memory (either for reading or writing), it removes its own Request to control logic 45 and enters into a hardware Slave state. Upon entering the hardware Slave state, control logic 45 disables DRAM controller buffer 65 as shown by the depiction that no directional arrow proceeds out from (points away from) buffer 65. Control logic 45 also sets control transceivers 75 to drive address signals from backplane 78 to DRAM 35 as shown by directional arrows 73 and 77, and sets data transceivers 85 to drive data from backplane 78 to DRAM 35 as shown by directional arrows 87 and 83.

Control logic 40 acknowledges this by entering into a hardware Master state wherein controller 20 is allowed access to both memories 30 and 35. Control logic 40 enables its local DRAM controller buffer 60 as shown by directional arrow 62; sets control transceivers 70 to drive from controller 20 to backplane 78 as shown by directional arrow 73; and enables data transceivers 80 to drive from controller 20 to backplane 78 as shown by directional arrow 87.

Next, DRAM controller 50 performs a DRAM write cycle by driving the row address to access its own DRAM 30 as shown by directional arrow 64 and by driving the same through control transceivers 70 and 75 to access DRAM 35 of controller 25 as shown by directional arrows 66, 73 and 77. RAS is then asserted, the column address is driven, and CAS is likewise asserted to write appropriate data to DRAM 30 (as shown by directional arrow 71 and 74), and, substantially simultaneously, to DRAM 35 (as shown by directional arrows 76, 87 and 83). Accordingly, this writing of data to DRAM 30 and 35 is to mirrored address locations, and is performed in a substantially real-time, synchronous manner.

In reference now to the concept of failure detection (FIGS. 3 and 4), one implementation of detecting failure utilizes arbitration control logic 40 and 45. Each control logic generates state transition signals to identify a mirrored memory access status for the controller on which the control logic resides. Each control logic also monitors the state transition signals of the other. A failure in the mirrored memory system between the dual controllers is detected by one controller sensing an incorrect state transition signal communicated from the other controller. A failure is also detected by one controller not sensing a state transition signal from the other within a specified timeout period. Memory refresh cycles are tapped to cause the arbitration control logic to cycle through state transition signals thereby forcing each controller to attempt a mirrored memory access on a regular basis whereby a memory system failure may be detected. This system and method affords reliability in any dual controller relationship, such as logical master/master (peer/peer) or logical master/slave. It is especially valuable in a logical master/slave controller relationship because a slave controller may not access the mirrored memory often and, therefore, would not detect whether the remote controller has failed until a later and potentially detrimental time.

When a memory access cycle (read, write, or refresh) is signaled to occur by a DRAM controller 50 or 55, that signal is driven to its local control logic 40 or 45. If that local controller does not currently have mirrored memory access, the local control logic drives a state transition signal to the other (remote) controller requesting such access. The state transition signal identifies the mirrored memory access status of the (local) controller sending the signal. For example, in this instance, a state transition signal requesting memory access is sent to the remote control logic. Responsively, the remote controller having mirrored memory access senses the requesting state transition signal and replies with a responsive state transition signal which grants the requesting controller access to the mirrored memory. The response is granted after the remote controller completes its own mirrored memory access if such is occurring when the request is received. This process is essentially the same as previously described in reference to FIG. 4 for a real-time, synchronous write.

As soon as the local control logic sends the memory request, it initiates its own timer to clock a timeout period. If the remote controller does not respond within the predetermined interval of time, i.e., the timeout period, the local controller recognizes that a failure has occurred with the remote controller memory system or with the arbitration means associated with the remote controller.

A remote controller memory system failure is also detected upon the sensing by the local controller of an incorrect state transition signal sent from the remote controller. For example, if the local controller is expecting to receive a state transition signal granting it access to the mirrored memory, but instead receives some other state transition signal from the remote controller, the local controller recognizes that a failure has occurred.

By way of these state transition signals sent between the control logic on each controller, and in conjunction with the specified timeout interval associated with each state transition signal, each controller (1) sends its own mirrored memory access status to the other controller, (2) senses the access status of the other controller, and/or (3) senses whether an appropriate status signal is sent. Furthermore, memory refresh cycles are tapped to force arbitrary cycling through the state transition signals whereby mirrored memory is accessed on a regular basis to provide for a consistent and reliable means for failure detection in the memory system.

Figure 5:
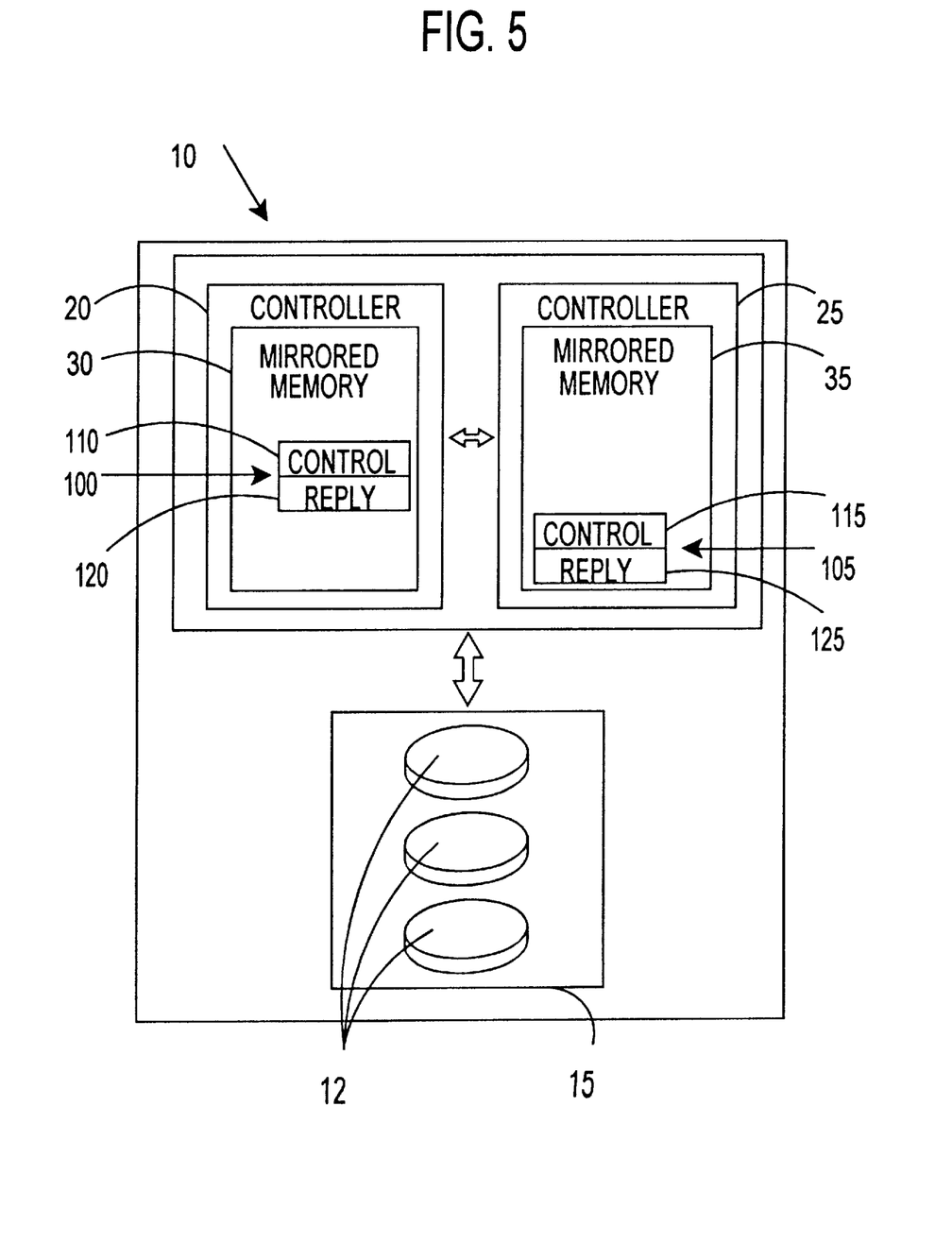
FIG. 5 is a block diagram depicting a preferred embodiment communication path between each controller mirrored memory.

Referring now to FIG. 5, another means for communication and logical failure detection between the controllers includes messaging mailboxes and a tightly coupled communication protocol therewith. Namely, in each mirrored memory 30 and 35, a reserved portion 100 and 105 is designated generally as a messaging mailbox. Mailboxes 100 and 105 are used as an underlying logical layer of communication and control means to monitor and coordinate activities between the controllers.

Through each mailbox, communication occurs between controllers 20 and 25 to provide a cost effective real-time link, and to allow each controller to monitor the state of the duplicate controller and to coordinate activities. Communication works by a (local) controller writing a message to its own mailbox and then the other (remote) controller reading the message out of that same mailbox.

Since the communication path established between the mailboxes is a critical component for retaining mirror accuracy and for providing an immediate failover capability, all precautions must be taken to retain communication integrity therebetween. Accordingly, in order to avoid damage to the communication process itself, and to avoid collateral damage to a controller's memory when communicating through the mailboxes (i.e., in order to retain data integrity in the event of some failure), each mailbox 100 and 105 is read and written by the controller on which the mailbox resides but only read by the other controller. For example, controller 20 reads and writes its own mailbox 100, and only reads the other mailbox 105. Likewise, controller 25 reads and writes its own mailbox 105, and only reads the other mailbox 100. Although memory 30 and 35 is generally mirrored memory, mirroring is selectively controlled (disabled) during writing of reserved mailbox portions 100 and 105 to effectuate communication therebetween and to avoid unintentional collateral damage to the other controller's memory. During reading of the other (remote) mailbox, the mirroring process is likewise selectively controlled such that only the remote data is read.

Each mailbox 100 and 105 actually comprises at least two separate mailbox parts in the preferred embodiment: one control mailbox 110 and 115 for holding and communicating a control message, and one reply mailbox 120 and 125 for holding and communicating a reply message. The control message is a specific request (or inquiry) intended for the other controller, whereas the reply message is a specific response to a request or inquiry. Also, although not shown in the drawing, for the purpose of simplicity in using general purpose mirrored memory there are addresses in each memory corresponding to control and reply mailboxes that are unused.

For clarification, mailboxes 100 and 105 make up a full duplex communication path. Specifically, requests made in mailbox 100, control part 110, are replied to in mailbox 105, reply part 125. Additionally, requests made in mailbox 105, control part 115, are replied to in mailbox 100, reply part 120.

Communication of messages between the mailboxes and controllers occurs only through a tightly coupled communication protocol to insure proper messaging. Namely, for each message there is a specific, unambiguous, and unique response (reply) to a specific, unambiguous, and unique request (inquiry). This allows a receiver of a reply (i.e., an initiator of a request or inquiry) to validate that a reply is indeed the answer to his specific request.

Further contributing to the communication path between controllers 20 and 25, a sliding window interlock scheme is used in association with any message written into mailboxes 100 and 105. As is known in the art, and in context of this invention, a sliding window interlock scheme includes the use of an identification number with each message to further insure message detection and one-to-one message correctness. For example, when a requesting controller writes a request message into its control mailbox, a sliding window interlock identification number is written also. When the other reply controller reads the message, it reads the identification number also. Consequently, when the reply controller writes a reply message to its own reply mailbox in response to the request message, it includes the same identification number with the reply. When the requesting controller reads the reply message, it also reads the identification number to make sure it is the same number as originally sent with the request message, and thus the requesting controller is able to detect and be sure that the reply is in fact an intended reply to its original request.

To further expound on the means of communication and detection of messages in the present invention, and for simplicity purposes, the use of the term "requesting controller" shall mean a controller that writes a message into its own control mailbox, and subsequently reads a reply message from the other controller's reply mailbox. The use of the term "reply controller" shall mean a controller that reads a message from the control mailbox of the other controller, and subsequently writes a reply message to its own reply mailbox.

After a requesting controller writes a message into its own mailbox, it immediately communicates to the reply controller that a message exists in the requesting controller's mailbox for the reply controller to read. The requesting controller communicates this by generating an interrupt signal to the reply controller. The interrupt signal is generated by hardware and/or software as is commonly known in the art.

A reply controller is able to detect that a message exists in a requesting controller's mailbox in two distinct ways, either of which may be used as a primary means of detection. On the one hand, a reply controller detects that a message exists by detecting the interrupt signal generated by the requesting controller which explicitly communicates to the reply controller that a message exists. On the other hand, the reply controller detects that a message exists by polling the requesting controller's mailbox on a timed interval basis, regardless of ever receiving the interrupt signal generated by the requesting controller. In the preferred embodiment, the timed interval is approximately 16 seconds. Each controller responds to its own clock upon the timed interval basis by polling the other controller's mailbox to detect whether a message exists. This dual method of detecting messages provides additional robustness and reliability of communication between the controllers in the case of failure of one method or the other.

As discussed, a controller is able to detect and read a message that has been written in the other controller's mailbox. This type of message is referred to as an "express" message. However, a controller may also detect and "read" an "implied" message that is not actually written in the other controller's mailbox. An "implied" message may be "read" from an interpretation of a set of circumstances relating to either controller. For example, assume a requesting controller sends a request message but never receives a reply message back from the other controller (this state being recognized upon detection of a timeout interval), or a reply message received was inappropriate or incorrect due to some communication problem associated with either of the controllers. In these instances, an "implied" communication has occurred. Namely, the requesting controller did not receive an "express" reply message back, but given the detection or recognition of not having received an express reply message, the requesting controller "reads" the circumstances, i.e., no reply message received, and initiates appropriate action accordingly.

Appropriate action is any predefined standard operating procedure (SOP) which the controllers are designated to follow. As an example, appropriate action may be for the requesting controller to enter into an isolation mode wherein mirroring is selectively disabled between the controllers, and the requesting controller assumes control of the disk storage system on its own until a repair of the failure of communication occurs. It is understood that any number and variety of SOPs may be designated and followed in response to an implied or express message, and it is not the purpose here to define all those possibilities. It is the purpose here to only reflect the fact that some predefined action is taken by a controller in response to an express or an implied message detected.

As previously indicated, a reply controller reads the message contained in the requesting controller's control mailbox 110 or 115 upon detecting that a request message exists (via interrupt or polling). In response to the request, the reply controller then writes a specific reply to its own reply mailbox 120 or 125 and subsequently sends an interrupt signal back to the requesting controller following the same procedure that the requesting controller followed. The requesting controller then detects the message in the reply controller's reply mailbox via the interrupt or the timed interval poll previously described. Consequently, each controller takes appropriate action based on the request and reply messages.

Figure 6:
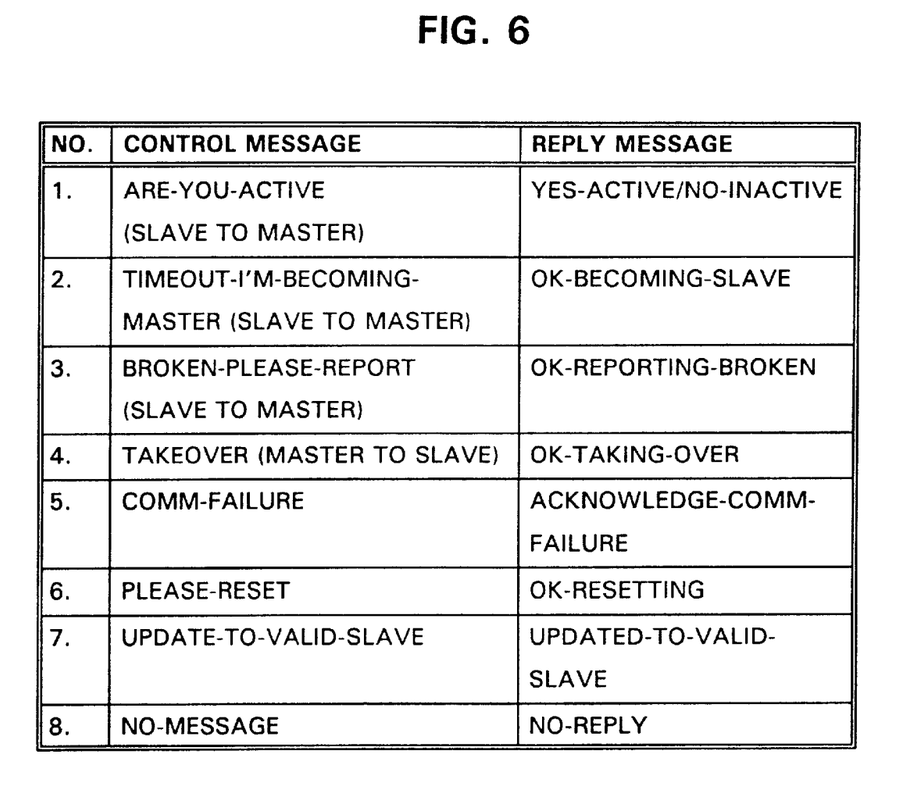
FIG. 6 is a table depicting messages representative of the tightly coupled communication protocol embodied in the present invention.

Referring now to FIG. 6, a table depicting messages representative of the tightly coupled communication protocol embodied in the present invention is shown. The tightly coupled communication protocol is only one element of the present invention system and method for retaining real-time, synchronous mirrored memory and for detecting a failure in either controller in order to provide for immediate and accurate failover. This tightly coupled protocol demonstrates how for each message, a specific, unambiguous response to a specific, unambiguous request occurs to be sure communication is precise, understood, and known.

The messages are numbered in the table for ease of reference in this discussion only and do not relate to the messages in any way other than for this descriptive reference. It is understood that the messages shown are not intended to depict all the possible messages that may be used under the tightly coupled communication protocol of the present invention. Rather, these messages are merely representative of what is used in the preferred embodiment.

The term "message sent" will refer to the fact that a message has been written by a controller to its own mailbox (either control or reply mailbox, as appropriate, given the state of the communication occurring), even though it is understood that the message is not actually "sent" anywhere but, in fact, is merely read from the mailbox by the other controller as previously discussed herein. Also, the term "Master" refers to the logical Master controller that is presently operating on and responding to all host computer requests relative to the disk storage system, and the term "Slave" refers to the logical Slave status of the other controller (i.e., the controller not responding to host requests).

FIG. 6 is representative of the messages that would most likely be used in a dual controller with a logical Master/Slave relationship. However, it is obvious that the principles of the present invention are equally applicable to other multiple controller relationships (i.e. Master/Master, etc.).

Message number 1, ARE-YOU-ACTIVE, is a message sent by the Slave controller to the Master as a heartbeat message (sent periodically) and used by the slave to detect when the Master has failed. If the Master is still active and communicating, its only response is YES-ACTIVE, which indicates all is in order. On the other hand, if the Master recognizes tMat it is no longer serving as Master or is no longer able to serve as Master, its only response is NO-INACTIVE. Given either of these specific, unambiguous replies in response to the specific, unambiguous request, each controller knows exactly what action to take.

Message number 2, TIMEOUT-I'M-BECOMING-MASTER, is a message sent by the Slave when it detects that a timeout has occurred, i.e., the Master has not replied within a given time period (which is directly related to the rate of the timer based polling of messages). The only response the Master can reply with is OK-BECOMING-SLAVE, meaning the Slave will then become the Master. Alternatively, the Master may not be able to respond due to some failure, and the Slave becomes Master anyway in recognition of the failure to respond.

Message number 3, BROKEN-PLEASE-REPORT, is a message sent by the Slave to the Master when the Slave detects its own failure. The only response the Master can reply with is OK-REPORTING-BROKEN, meaning the Master reports the failure to the host computer.

Message number 4, TAKEOVER, is a message sent by the Master to the Slave when the Master wants the Slave to become the new Master. The only valid reply the Slave can respond with is OK-TAKING-OVER.

Message number 5, COMM-FAILURE, is a message sent by either controller to the other when some communication failure has been detected. The only valid reply is ACKNOWLEDGE-COMM-FAILURE.

Message number 6, PLEASE-RESET, is a message sent by either controller to the other when the other needs to be reset to correct some failure that has occurred. The only valid reply is OK-RESETTING.

Message number 7, UPDATE-TO-VALID-SLAVE, is a message sent by the Master to the Slave in order for the Slave to update its mirrored state variables. The only valid reply in this instance is UPDATED-TO-VALID-SLAVE.

Message number 8, NO-MESSAGE/NO-REPLY, is a message sent by either controller to the other to validate that no message (or reply, as the case may warrant) is being sent in the respective control or reply mailbox to which the NO-MESSAGE/NO-REPLY is written. For example, this messaging is to be sure that the reply mailbox is communicating a "valid" message of "nothing" or "null" (i.e., NO-REPLY) when a control message is sent to the control mailbox. Likewise, it is to be sure that the control mailbox is communicating a "valid" message of "nothing" or "null" (i.e., NO-MESSAGE) when a reply message is sent to the reply mailbox. Moreover, NO-MESSAGE/NO-REPLY is sent to communicate that no other message is being transmitted or expected at the present time. As a more particular example, when a requesting controller writes a message (such as ARE-YOU-ACTIVE) into its own control mailbox, it also writes a NO-REPLY message into its own reply mailbox so that the other controller knows that this is a control message being sent and not some erroneous reply message being sent.

Each of these examples shows how a tightly coupled communication protocol is followed between the controllers for monitoring and coordinating their activities. Each request and reply message is very specific and unambiguous, and each "null" message is specific and unambiguous so that express communication is absolutely understood, and implied communication occurs from a lack of express communication detected by the tightly coupled protocol.

Thus far, it has been disclosed how operational failover occurs with the present invention when dual controllers 20 and 25 are being used concurrently in storage management system 10. However, the present invention also allows for accurate and complete failover to occur from a failed stand-alone controller. Namely, assume storage management system 10 is being used with a single controller, such as controller 20 (in slot "A"), in a stand-alone mode, and controller 25 is not presently inserted in the system. If controller 20 fails, and the failure is not related to the NVDRAM memory or its access circuitry, then the present inventive system allows for a hot swap such that controller 25 may be inserted into slot "B" to allow for complete failover from controller 20 to controller 25. Specifically, failover occurs without the need for any preparatory intervention. No preliminary commands or the like are necessary for detecting the status and accuracy of the mirror contents of the failed controller, and no preparation or manipulation is necessary to write the memory contents of the failed controller to the newly inserted (hot swapped) controller.

If a stand-alone controller 20 failure occurs, the means and method of failover is as follows:

(1) a workable (new) controller 25 is physically inserted into its controller slot "B", either with system power on or off;

(2) the new controller 25 detects from the state of the failed (remote) controller 20 the state of the remote NVDRAM that the remote controller was the master controller, thus the new controller assumes a passive (slave) state;

(3) the new controller detects through heartbeat messages or through an explicit "Take Control" command from the host that it should become the master;

(4) the new controller tests its local NVDRAM memory (without specifically altering its contents) to insure its proper operation;

(5) the new controller tests the remote NVDRAM memory (without specifically altering its contents) to insure its proper operation;

(6) the new controller checks to see if the two NVDRAM images are alike, and discovers that there are differences between the two images;

(7) the new controller determines (through the disclosed state in each of the NVDRAM memories) that the remote NVDRAM is the correct image to be maintained for this disk subsystem;

(8) the new controller copies (extracts) the remote NVDRAM image to its local NVDRAM image and updates the state information relating to the newly acquired image;

(9) the new controller begins servicing host requests.

Accordingly, pursuant to the stand-alone failover capabilities of the present invention, complete and accurate failover occurs from a failed stand-alone controller to a newly inserted controller without loss of critical data and without preparatory intervention.

Additionally, when running with two controllers which are actively mirroring, either controller can use the same hot swap feature referred to above to be removed from the system without the need for preparatory commands to prepare that controller for removal. This further enhances the ability for the system to recover from hardware failures from ether of the two controllers.

Another means for providing accurate failover is by constantly monitoring and detecting the data consistency of the mirror image on each controller memory by way of "scrubbing" of the memory. This scrubbing process helps detect errors in the memory and retain an accurate mirror image in preparation for a potential failover event.

In the dual controller context, the logical Master controller performs the scrub process preferably in a background mode or when the system 10 is idle. The scrubbing process reads each and every address location to find correctable/uncorrectable errors and to fix such errors to ensure consistency between the controllers. Scrubbing continually monitors the consistency of the two mirrored memory images to ensure they remain synchronized (accurate) for a future point of failure.

Although regular memory accesses will also find and fix such errors, regular memory accesses do not always access each address location in a periodic and timely manner like the scrub process does. Likewise, although the memory refresh cycles as discussed in FIGS. 3 and 4 access memory to detect whether a failure has occurred in the arbitration for memory access, the refresh cycles do not check for consistency and do not correct logical bit failures. In contrast, the scrub process does provide for correction of errors by employing error correction techniques commonly known in the art, and/or by using the redundant memory shared between the controllers.

An additional benefit of using real-time mirrored memory processing is that it allows for a concurrent access to a single disk storage control data set (particularly beneficial in a logical Master/Master dual controller relationship). The disk storage control data set includes control structures, mapping, cache, and structures controlling host requests in progress. Specifically, both controllers have real-time access to the data control structures associated with that data set. Therefore, concurrent access by a host computer to the same data set is provided without additional manipulation or DMA activity to satisfy the host requests from either controller. For example, a specific host request accessing data from a specific logical address which resides on disk or in cache can be serviced by either controller in a logical Master/Master dual controller relationship.

In summary, and in reference to all figures, the present invention system provides a fault tolerant computer disk storage control system by using dual controllers 20 and 25 and mirrored memory 30 and 35. A substantially complete, accurate, and immediate operational failover from one controller to the other is provided by:

(1) minimizing the time required to maintain the shared (mirrored) memory information thus providing a means to maintain system I/0 performance while providing greater accuracy and reliability of failover;

(2) managing the memory synchronization and consistency in real time by using mirrored memory constructs in conjunction with communicating therebetween by means of messaging mailboxes 100 and 105 and a tightly coupled communication protocol;

(3) synchronizing messages between the controllers by means of messaging mailboxes, a tightly coupled communication protocol, interrupt signals, and independent timer detection intervals;

(4) protecting each mirrored memory from corruption resulting from the communication process between the controllers by having each controller write only to its own mailbox and not to the other controller's mailbox for messaging purposes and having each controller only read the other controller's mailbox;

(5) managing the consistency of the mirrored memory by continually monitoring and verifying communications between the controllers by means of the mailboxes and communication protocol;

(6) managing a communication process error or total communication break down between the controllers by detecting and responding to express and implied communications and using standard operating procedures;

(7) managing hardware failures by detecting and responding to appropriate express or implied communication messages and by using standard operating procedures;

(8) keeping the failover data image of each controller memory accurate by scrubbing of the memory image;

(9) detecting controller failure, communications failure, and memory failure by means of the mail box messaging constructs;

(10) detecting memory system failure by tapping the memory refresh cycles;

(11) selectively disabling the mirroring process and granting control to the non failed controller upon detection of a failed controller.

What has been described above are the preferred embodiments for a dual controller disk storage system whereby real-time, mirrored memory provides complete, accurate, and immediate failover in the event of controller failure. It is clear that the present invention offers a powerful tool for providing a cost effective, real-time link between controllers, for allowing each controller to monitor the state of the other, and for allowing each controllers' activities to be coordinated. Moreover, it will be obvious to one of ordinary skill in the art that the present invention is easily implemented utilizing any of a variety of hardware and software tools existing in the art. While the present invention has been described by reference to specific embodiments, it will be obvious that other alternative embodiments and methods of implementation or modification may be employed without departing from the true spirit and scope of the invention.

What is claimed is:

1. A computer disk storage control system adapted to be connected to a host computer, comprising:

(a) first and second disk controllers, each having memory thereon;

(b) means for writing data directly to the first and second disk controller memory, substantially simultaneously, responsive to a single bus access by one of the first and second disk controllers, whereby a mirrored memory is obtained and maintained between the disk controllers at all points in time;

(c) means for monitoring and detecting a failure or inconsistency in the memory of either of the disk controllers, or a failure in either of the disk controllers; and, (d) means for providing immediate and complete operational failover from one disk controller to the other upon detection of the failure.

2. The system of claim 1 wherein the memory is selected from the group consisting of: (i) a random access memory made non-volatile by backup power supply means; and (ii) a non-volatile random access memory.

3. The system of claim 1 wherein the means for writing provides access for each controller to a same disk storage control data set and disk data, and concurrent and ready access by the host computer to the same disk storage control data set and disk data from each controller without need for additional data manipulation or extra direct memory access (DMA) activity to satisfy host requests.

4. The system of claim 1 wherein the means for writing includes means for selectively writing the data to the first and second controller memory.

5. The system of claim 1 wherein the means for writing further includes means on the second controller for extracting/copying the data from the first controller memory to the second controller memory, regardless of a failure of the first controller, in the event the second controller becomes a part of the disk storage control system subsequent to the first controller and the memory of the first controller accessible by the second controller, whereby a mirror image of the memory of the first controller is created in the memory of the second controller.

6. The system of claim 1 further including control means on each controller for controlling access to the respective controller memory.

7. The system of claim 6 wherein the control means includes a memory controller, arbitration control logic, buffers, and transceivers for enabling, disabling, and selecting flow direction of memory address and data signals.

8. The system of claim 1 wherein the means for providing failover includes means for monitoring and detecting an accuracy status and consistency of the mirrored memory.

9. The system of claim 8 wherein the means for providing failover includes means for correcting an error in the mirrored memory based on the accuracy status detected for the purpose of preserving mirrored image consistency.

10. The system of claim 1 further including means for hot swapping one of the controllers without preparatory intervention.

11. A method of providing operational failover in a computer disk storage control system adapted to be connected to a host computer, the disk storage control system having first and second disk controllers, each controller having memory thereon, the method comprising:

(a) writing data directly to the first and second controller memory, substantially simultaneously, responsive to a single bus access by one of the first and second disk controllers, whereby a mirrored memory is obtained and maintained between the controllers at all points in time;

(b) monitoring and detecting a failure or inconsistency in the memory of either of the controllers, or a failure in either of the controllers; and, (c) providing immediate operational failover from one of the controllers wherein the failure was detected to the other of the controllers.

12. The method of claim 11 wherein the memory is selected from the group consisting of: (i) a random access memory made non-volatile by backup power supply means; and (ii) a non-volatile random access memory.

13. The method of claim 11 wherein the writing provides access for each controller to a same disk storage control data set and disk data, and concurrent and ready access by the host computer to the same disk storage control data set and disk data from each controller without need for additional data manipulation or extra direct memory access (DMA) activity to satisfy host requests.

14. The method of claim 11 wherein the writing includes selectively writing the data to the first and second controller memory.

15. The method of claim 11, wherein steps (a) and (b) are reversed in order and the writing includes selectively writing the data to the first and second controller memory such that the data is extracted/copied by the second controller from the first controller memory, regardless of a failure of the first controller, in the event the second controller becomes a part of the disk storage control system subsequent to the first controller and the memory of the first controller is accessible by the second controller, whereby a mirror image of the memory of the first controller is created in the memory of the second controller.

16. The method of claim 11 further including granting to one of the controllers access to both controller memories substantially concurrently.

17. The method of claim 11 further including correcting an error in the mirrored memory based on a mirrored memory accuracy status detected for the purpose of preserving mirrored image consistency.

18. The method of claim 11 further including hot swapping one of the controllers wherein the failure was detected without preparatory intervention.

19. A computer readable medium having computer executable instructions for providing operational failover in a computer disk storage control system adapted to be connected to a host computer, the disk storage control system having first and second disk controllers, each controller having memory thereon, the instructions for performing the function comprising:

(a) writing data directly to the first and second controller memory, substantially simultaneously, responsive to a single bus access by one of the first and second disk controllers, whereby a mirrored memory is obtained and maintained between the controllers at all points in time;

(b) monitoring and detecting a failure or inconsistency in the memory of either of the controllers, or a failure in either of the controllers; and, (c) providing immediate operational failover from one of the controllers wherein the failure was detected to the other of the controllers.

* * * * *